(12) United States Patent
Foo et al.

(10) Patent No.: US 6,246,897 B1
(45) Date of Patent: Jun. 12, 2001

(54) METHOD AND SYSTEM FOR ACQUISTION OF PREFERENTIAL ARTERIAL AND VENOUS IMAGES FOR MR ANGIOGRAPHY

(75) Inventors: Thomas K. F. Foo, Rockville; Vincent B. Ho, North Bethesda, both of MD (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 09/210,334

(22) Filed: Dec. 11, 1998

(51) Int. Cl.$^7$ .................................................. A61B 5/00
(52) U.S. Cl. ......................... 600/413; 324/307; 324/309
(58) Field of Search .................................. 600/413, 410, 600/420; 324/306, 307, 309

(56) References Cited

U.S. PATENT DOCUMENTS

| | | |
|---|---|---|
| 4,995,878 | 2/1991 | Rai ........................................ 606/194 |
| 5,315,997 | 5/1994 | Widder et al. ..................... 128/653.3 |
| 5,445,812 | 8/1995 | Gotou .................................... 424/9.4 |
| 5,897,496 * | 4/1999 | Watanabe ............................. 600/413 |
| 5,997,883 * | 4/1999 | Epstein et al. ....................... 424/306 |

OTHER PUBLICATIONS

Pelc. Norbert J., et al., *Quantitative Magnetic Resonance Flow Imaging*, Magnetic Resonance Quarterly, vol. 10, No. 3, pp. 125–147.

Nishimura, Dwight, et al., *Magnetic Resonance Angiography*, IEEE Transactions on Medical Imaging, vol. MI–5, No. 3, Sep. 1986, pp. 140–151.

Walker, M.F., et al., *Quantitative Flow Measurement in Phase Contrast MR Angiography*, Journal of Computer Assisted Tomography, 12(2), pp. 304–313, Mar./Apr. 1988.

(List continued on next page.)

*Primary Examiner*—Marvin M. Lateef
*Assistant Examiner*—Eleni Mantis Mercader
(74) *Attorney, Agent, or Firm*—Cook & Franke S.C.; Christian G. Cabou; Phyllis Y. Price

(57) ABSTRACT

A system and method for the acquisition of preferential arterial and venous images is disclosed. The invention includes setting a noise level in the phase image, that is proportional to the velocity encoding value, at a threshold level above the venous signal but below the arterial signal during a systolic portion of the cardiac cycle and acquiring a phase contrast MR image during the systolic portion that effectively acquires the arterial signal and suppresses the venous signal. During the diastolic portion of the same R—R interval, the velocity encoding value is then set to establish a noise threshold level in the phase image lower to a value below the venous signal but above the arterial signal to acquire the venous signal and suppress the arterial signal. In this manner, either an arterial only image or a venous only image can be displayed. Alternatively, the images can be combined to create a higher SNR arterial and venous image.

23 Claims, 4 Drawing Sheets

OTHER PUBLICATIONS

Moran, Ph.D., Paul R., *A Flow Velocity Zeugmatographic Interlace for NMR Imaging in Humans*, Magnetic Resonance Imaging, vol. 1, pp. 197–203, 1982.

Moran, Ph.D., Paul R., et al., *Verification and Evaluation of Internal Flow and Motion*, Radiology 1985; 154: 433–441.

Firmin, D.N., et al., *In Vivo Validation of MR Velocity Imaging*, Journal of Computer Assisted Tomography, vol. 11, No. 5, 1987, pp. 751–756.

Bernstein, Ph.D., Matt A., et al., *Comparison of Phase-Difference and Complex-Difference Processing in Phase-Contrast MR Angiography*, JMRI Nov./Dec. 1991, vol. 1, No. 6, pp. 725 and 729.

Bernstein, Ph.D., Matt A., et al., *Minimizing TE in Moment-nulled or Flow-encoded Two- and Three-dimensional Gradient-Echo Imaging*, JMRI, Sep. 1992, vol. 2, No. 5, pp. 583–588.

Wedeen, VJ, *Projective Imaging of Pulsatile Flow with Magnetic Resonance*, Science, 1985; vol. 230, pp. 946–848.

Lebowitz, JA, et al., *Gadolinium-Enhanced Body MR Venography with Subtraction Technique*, AJR:169, Sep. 1997, pp. 755–758.

Steffens, JC, et al., *Cardiac-Gated Two-Dimensional Phase Contrast MR Angiography of Lower Extremity Occlusive Disease*, AJR:169, Sep. 1997, pp. 749–754.

* cited by examiner

METHOD AND SYSTEM FOR ACQUISTION OF PREFERENTIAL ARTERIAL AND VENOUS IMAGES FOR MR ANGIOGRAPHY

BACKGROUND OF THE INVENTION

The present invention relates generally to magnetic resonance imaging (MRI) and more particularly, to a system and method to selectively create separate venous and arterial blood flow images for use in MRI angiography.

Quantitative flow data can readily aid in the diagnosis and management of patients and also help in the basic understanding of disease processes. There are many techniques available for the measurement of blood flow, including imaging based methods using radiographic imaging of contrast agents, both in projection and computed tomography (CT), ultrasound, and nuclear medicine techniques. Radiographic and nuclear medicine techniques require the use of ionizing radiation and/or contrast agents. Some methods involve making assumptions about the flow characteristics which may not necessarily be true in vivo or require knowledge about the cross-sectional area of the vessel or the flow direction. Ultrasound techniques are difficult to apply in certain situations because of intervening bone or air.

MRI utilizes radio frequency pulses and magnetic field gradients applied to a subject in a strong magnetic field to produce viewable images. Contrast agents are used to improve MR images. Such contrast agents include magnetizable substances having metals or metallic compounds. Such contrast agents may be paramagnetic, ferromagnetic, or superparamagnetic and act through dipole interactions with tissue protons. Most MR imaging contrast agents have similar mechanisms of action. Most are based on gadolinium chelates and therefore, are paramagnetic agents that develop a magnetic moment when placed in a magnetic field.

With the increasing use of MR contrast agents for MR angiography (MRA), arterial and venous signals become equally enhanced. The reduced $T_1$ relaxation time removes the possibility of using spatial saturation RF pulses to eliminate either arterial or venous signals for flow discrimination. Automatic bolus detection merely addresses this issue by triggering the acquisition only when the flow is in the arterial phase. However, with the contrast already on board, subsequent acquisitions must contend with the increased venous signal intensity as the contrast agent continues to distribute in the system. In addition, the expected use of intravascular contrast agents with much longer persistence will require more novel techniques for arterial-venous discrimination.

Phase contrast magnetic resonance angiography (MRA) is a practical and clinically applicable technique for imaging blood flow. MRA makes use of flow encoding gradient pulses which impart a velocity-dependent phase shift to the transverse magnetization of moving spins while leaving stationary spins unaffected. Each phase contrast acquisition generates two images: a magnitude image that is proportional to the proton density of the object and may also be $T_1$-weighted, and an image representing the phase of the object. The phase image produced has information only from the moving spins and the surrounding stationary tissue is suppressed. Images representing both the average flow over the entire cardiac cycle and at a series of individual points in the cycle have been generated using this technique. The phase contrast MR method produces phase images with intensities that represent the magnitude of the flow velocity and also the direction of flow. Therefore, such images may be used for both qualitative observation of blood flow and quantitative measurement. The practical application of phase contrast MR angiography and venography to the quantitative determination of flow velocity is therefore evident.

In a phase contrast image, the phase shifts generated in a pixel by moving spins is directly proportional to the motion of the ensemble of spins. If the velocity is linear, then the phase shift is directly proportional to the velocity and the sign of the phase shift is indicative of the direction of flow. As phase representation are in terms of an angle, unique values of flow velocity and direction of motion can be obtained if the phase shifts are constrained between $\pm\pi$. That is, the velocity encoding value or VENC, is given by:

$$VENC = \frac{\pi}{\gamma \Delta M_1},$$

where $\gamma$ is the gyromagnetic ratio, and $\Delta M_1$ is the gradient moment and is proportional to the area of the flow encoding gradient waveform. This value of VENC is such that all flow velocities will have values constrained between $\pm\pi$. The noise level in the phase image is also proportional to the velocity encoding value. It can be shown that the noise level in the phase image, $\sigma_v$, is related to the VENC value by:

$$\sigma_v^2 = \frac{2VENC^2 \sigma^2}{\pi^2 |M|^2},$$

where M is the magnitude of the spins in a voxel, and $\sigma$ is the noise variance of the acquisition. Thus, by raising the VENC value, the noise level in the phase image increases correspondingly.

In one prior art time-of-flight MRA technique that gates the acquisition to systole and diastole to generate an image with enhanced arterial flow in systole, a second image is provided with less arterial flow enhancement in diastole. The venous flow in both images would be approximately the same, however. See Pulmonary Vasculature: Single Breath-Hold MR Imaging With Phased Array Coils. *Radiology* 1992; 183: 473–477, Foo T K F, MacFall J R, Hayes C E, Sostman H D, and Slayman B E. By subtracting the two images, the common venous flow mode can be eliminated, together with the stationary background noise. However, such a technique is not practical and patients with peripheral artery disease where the difference in flow between the systole and diastole is not significant. Other techniques which attempted to distinguish between arterial and venous flow require imaging during a first pass of the contrast agent, and then subtracting the images from the initial arterial phase from a latter venous or equilibrium pass. Such techniques have been found to be too dependent upon the unpredictable flow of the contrast agent in the patient.

It would therefore be desirable to have a method and apparatus for MRA that efficiently discriminates between arterial and venous signals to create a venous only image or an arterial only image using magnetic resonance imaging.

SUMMARY OF THE INVENTION

The present invention relates to a system and method for magnetic resonance (MR) angiography that can efficiently discriminate between arterial and venous signals to display either an arterial image, without venous representation, or a venous image, without an arterial representation, that solves the aforementioned problems.

Suppression of arterial and venous signals is achieved by exploiting a feature of phase contrast MR angiography. In phase contrast MR angiography, the velocity encoding or VENC value determines the noise floor in the phase image. This noise floor is directly proportional to the VENC value and is given in units of velocity. Spins with velocity below that of the noise floor are not evident in the phase image. Hence, by increasing the VENC value, signals from slower moving spins in the phase image are suppressed. As the arterial velocity in diastole is smaller than that of the venous velocity, signals from arterial structures are suppressed in diastolic-gated phase contrast acquisitions. As the venous velocity in systole is smaller than that of the arterial velocity, signals from the venous structures are suppressed in a systolic-gated phase contrast acquisition.

The present invention is preferably implemented using an MR phase contrast image acquisition designed to efficiently discriminate between arteries and veins using a segmented k-space fast-phase contrast pulse sequence to acquire images that are sensitive only to arterial flow while in a systolic phase of the cardiac cycle and only to venous flow while in a diastolic phase of the cardiac cycle. This technique is accomplished by gating the MRI acquisitions to each phase of the cardiac cycle. One portion of the acquisition is gated to the diastolic portion of the cardiac cycle, where arterial flow is minimal, wherein a sufficiently high velocity encoding value is selected such that the arterial flow signal is suppressed in the phase image, but is present in the accompanying magnitude image. Another portion of the acquisition is gated to the systolic portion of the cardiac cycle, where venous flow is less than arterial flow, wherein the velocity encoding value is adjusted such that the venous flow signal is suppressed in the phase image, but is present in the accompanying magnitude image. By combining each of the respective phase and magnitude images, either or both an MR arteriogram or an MR venogram can be produced.

Such pulse sequence acquisitions can acquire a flow directional sensitive image quite rapidly. For example, if the acquisition is gated to diastole, where arterial flow is minimal, the phase image will have a non-zero intensity for the venous component only. The magnitude image on the other hand, will contain both arterial and venous signals assuming that the flow is predominately in the superior-inferior direction, as in the peripheral vasculature. Therefore, only one flow encoding gradient direction is necessary.

The higher arterial flow velocities in systole and the use of a relatively high velocity encoding value allows for suppression of the venous signal by raising the noise floor in the phase image. For a venous only image, a second acquisition in the same R—R interval is gated to diastole, where arterial flow is minimal and is less than that of venous flow. By using a lower velocity encoding value, the venous flow is emphasized in the phase image but the arterial signals are suppressed beneath the noise floor. Pulsatility artifacts are avoided in the image gated to systole by reducing the acquisition time for that image. In the second acquisition, typically, a larger number of views per segment can be used since the venous flow is not pulsatile. In the additional time required to complete data acquisition of the arterial image in systole, more k-space lines can be collected for the venous image during diastole to either improve the SNR or the resolution of the latter image.

Therefore, in accordance with one aspect of the invention, a method of producing arterial suppressed images and venous suppressed images for MR angiography is disclosed and includes the steps of setting a first velocity encoding value to establish a noise level in the phase image above that of undesirable venous flow velocity signals during a systolic portion of the cardiac cycle and setting a second velocity encoding value to establish a noise level in the phase image above that of undesirable arterial flow velocity signals during a diastolic portion of the cardiac cycle. The method next includes the steps of acquiring a phase contrast MR image during each respective portion of the cardiac cycle where the undesirable flow velocity signals are below that of the noise level established by the first and second velocity encoding values, thereby suppressing the undesirable flow velocity signals and acquiring desirable flow velocity signals in the respective portion of the cardiac cycle and then, reconstructing at least one MR image having desirable flow velocity signals acquired during one portion of the cardiac cycle and without the undesirable flow velocity signals of that portion of the cardiac cycle. For example, a venous only image would have the arterial signal suppressed and an arterial only image would have the venous signal suppressed.

In accordance with another aspect of the invention, an MRI apparatus for MR angiography is disclosed that is capable of creating arterial only images and venous only images and includes an MRI system having a number of gradient coils positioned about a bore of a magnet to impress a polarizing magnetic field and an RF transceiver system and an RF modulator controlled by a pulse control module to transmit RF signals to an RF coil assembly to acquire MRI images. The MRI apparatus also includes a computer programmed to activate the MRI system in a prescan mode to acquire a venous signal during systole and an arterial signal during diastole from a patient. The computer is also programmed to set a first velocity encoding value at a level higher than the venous signal and set a second velocity encoding value at a level higher than the acquired arterial signal, and then to activate the MRI system to acquire a phase contrast image during systole using the first velocity encoding value as a noise threshold, and to acquire a phase contrast image during diastole using the second velocity encoding value as the noise threshold. Such a system can then provide either or both an arterial only image or a venous only image by simply combining the phase images and the magnitude images.

In accordance with yet another aspect of the invention, an angiography system to create separate venous blood flow images and arterial blood flow images while suppressing arterial blood flow signals and venous blood flow signals, respectively, is shown and includes an MRI apparatus capable of producing arterial and venous signals from a monitored patient. A user interface selects an MR image from a group consisting of an arterial only blood flow image and a venous only blood flow image. The system includes a velocity encoding module connected to the MRI apparatus to receive the arterial and venous signals from the MRI apparatus and produce a diastolic velocity encoding (VENC) value that establishes a noise level in the phase image. The diastolic velocity encoding value establishes a noise level that is greater than the arterial signal during a cardiac diastolic period. The velocity encoding module also produces a systolic velocity encoding value that establishes a noise level in the systolic phase image. The systolic velocity encoding value establishes a noise level that is greater than the venous signal during a cardiac systolic period. The system also includes a diastolic and a systolic image acquisition and reconstruction module connected to the velocity encoding module to produce a diastolic and a systolic magnitude image and a diastolic and a systolic phase image. A mask module is connected to receive the diastolic and systolic magnitude and phase images and produce a venous blood flow image and an arterial blood flow image. An image selector connected to the mask module is provided to display either one of the venous blood flow image or the arterial blood flow image based on an input from the user interface.

In accordance with yet another aspect of the invention, an MR angiography apparatus for displaying only one of venous blood flow and arterial blood flow includes a means for acquiring an MRI, a means for ECG-gating MRI acquisitions during a diastolic period and during a systolic period of a cardiac cycle, and a means for establishing a velocity encoding value to suppress arterial blood flow signals during the diastolic period MRI acquisitions and a different velocity encoding value to suppress venous blood flow signals during the systolic period MRI acquisitions. The MR angiography apparatus also includes a means for acquiring and reconstructing a magnitude image and a phase map image for each diastolic period MRI acquisition and systolic period MRI acquisition. A means for combining the reconstructed magnitude and phase map images to create venous only and arterial only output signals is used to display the images on a means for displaying as either a venous blood flow image or an arterial blood flow image.

Various other features, objects and advantages of the present invention will be made apparent from the following detailed description and the drawings.

BRIEF DESCRIPTION OF THE DRAWINGS

The drawings illustrate the best mode presently contemplated for carrying out the invention.

In the drawings.

DETAILED DESCRIPTION OF THE PREFERRED EMBODIMENT

Figure 1:
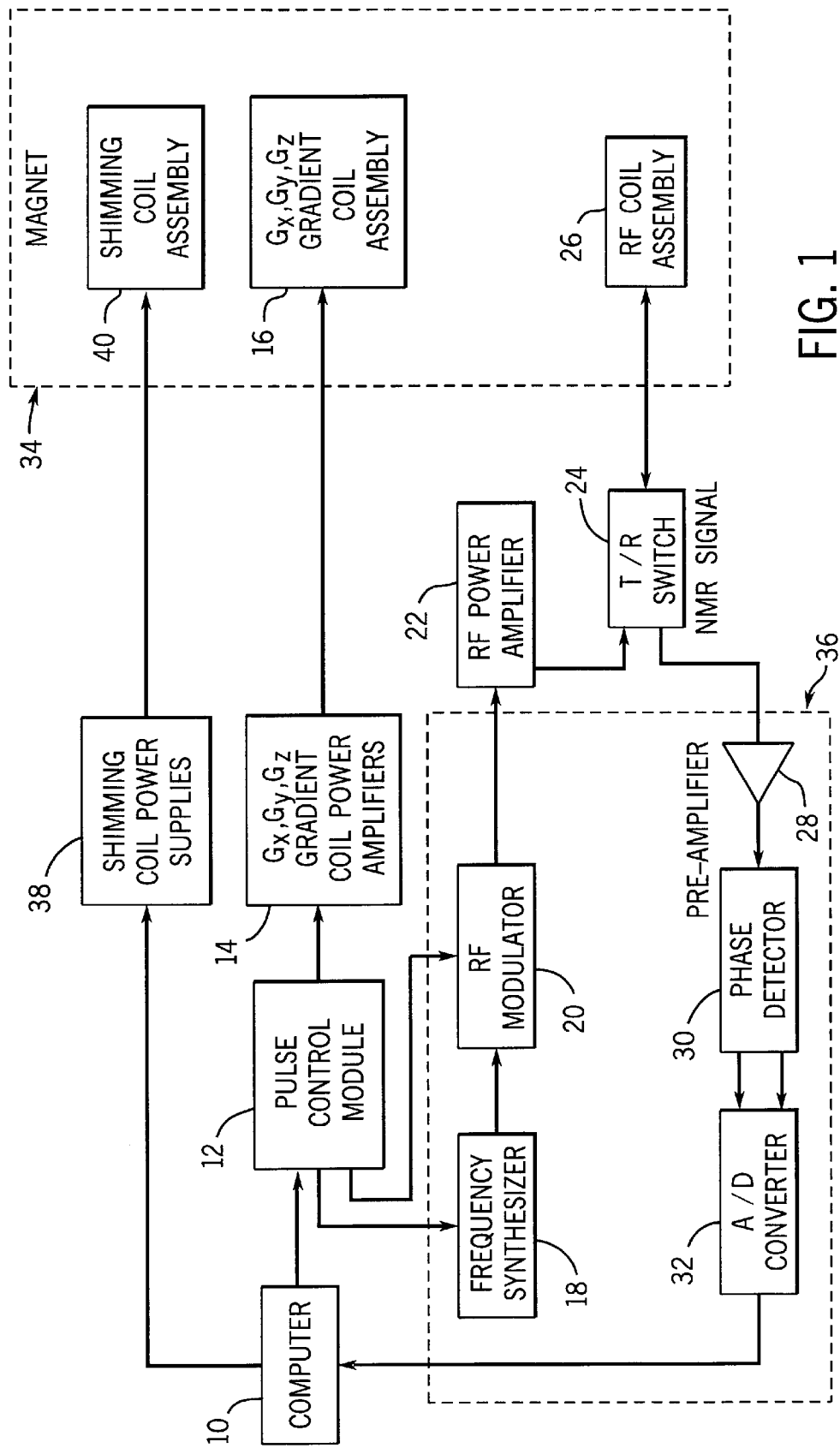
FIG. 1 is a schematic block diagram of an MR imaging system for use with the present invention.

Referring to FIG. 1, a magnetic resonance (MR) imaging system of a type suitable for the practice of the invention includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The MR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce MR images of the object. Computer 10 also controls shimming coil power supplies 38 to power shimming coil assembly 40.

The present invention includes a method and system for MRI angiography that includes preferential acquisition of arterial and venous images for use with the above-referenced MRI system, or any similar or equivalent system for obtaining MR images.

Figure 2:
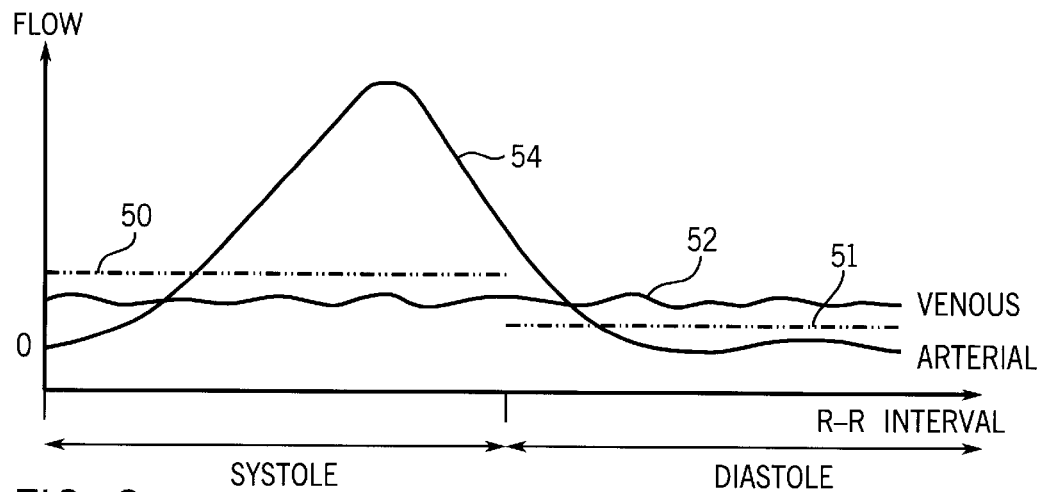
FIG. 2 is a graphical representation of arterial and venous flow velocities during a cardiac cycle.

Referring to FIG. 2, a typical cardiac R—R interval is shown in which the venous and arterial flow velocities are depicted in the descending aorta during systole and diastole. As shown, the dominant arterial flow is in systole. This tri-phasic flow velocity profile for arterial blood is typical of the peripheral vasculature. The present invention includes a method of discriminating between arteries and veins in MR angiography. In order to do so, a first velocity encoding (VENC) value 50 is set at a threshold level such that the noise level in the phase image is above that of the venous signal 52 during the systolic portion of the cardiac cycle, but below that of the arterial signal 54, also in the phase image. A second velocity encoding value 51 is set during the diastolic portion of the cardiac cycle at a threshold level such that the noise level in the phase image is above that of the arterial signal 52, in diastole, but below that of the venous signal 54.

Figure 3:
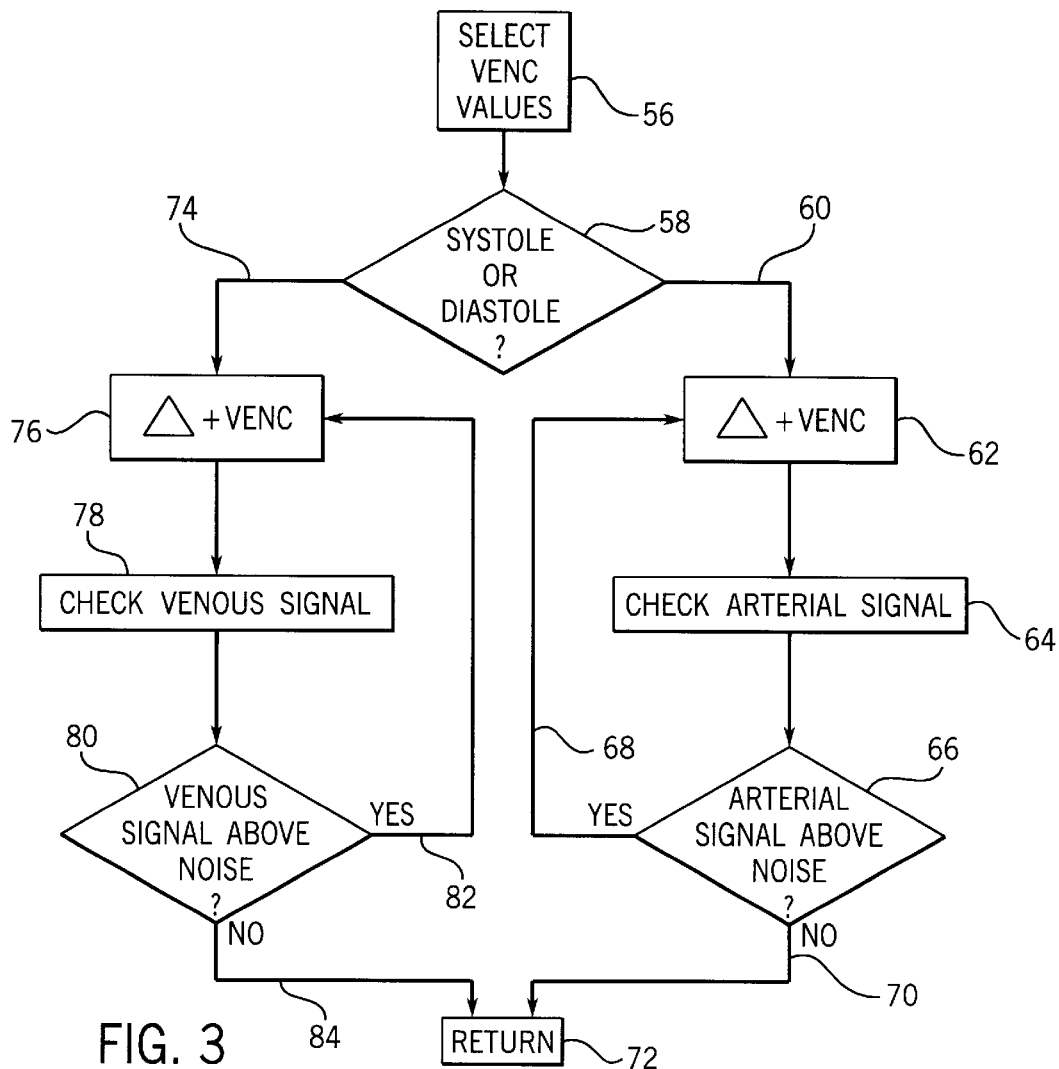
FIG. 3 is a flow chart of a portion of the system and method of the present invention.

Referring to FIG. 3, in order to set the first and second VENC values 50, 51, a setup VENC value subroutine 56 first decides whether the cardiac cycle is in systole or diastole 58. If in diastole 60, the previous VENC value 51 is incremented at 62 and the arterial signal is monitored at 64 during the diastolic period of the cardiac cycle. A comparison is then made between the arterial signal and the VENC value at 66, and if the arterial signal is above the noise level for that VENC value setting 68, then the VENC value is incremented at 62 and the steps of monitoring the arterial phase signal 64 and comparing the arterial phase signal to the noise level corresponding to that set VENC value 66 are repeated. Otherwise, when the noise corresponding to the VENC value is above the arterial phase signal 70, the present setting of the velocity encoding value is provided for use as the first velocity encoding value to acquire a phase contrast image during diastole and the system returns 72 to the main algorithm of FIG. 4. If, however, after entering the select VENC values subroutine 56 it is determined at 58 that the cardiac cycle is in a systolic phase 74, then the VENC value is incremented at 76 and the venous signal is monitored at 78 and as long as the venous signal is above the noise signal 80, 82, the VENC value is incremented at 76 and monitored and compared at 78 and 80. Once the VENC value is above the venous signal at 80, 84, the subroutine returns 72 to the main algorithm. In a preferred embodiment, the timed sequence of the velocity encoding value is initially dialed up above the venous signal during systole, and then is dialed down below the venous signal but above the arterial signal during diastole.

Figure 4:
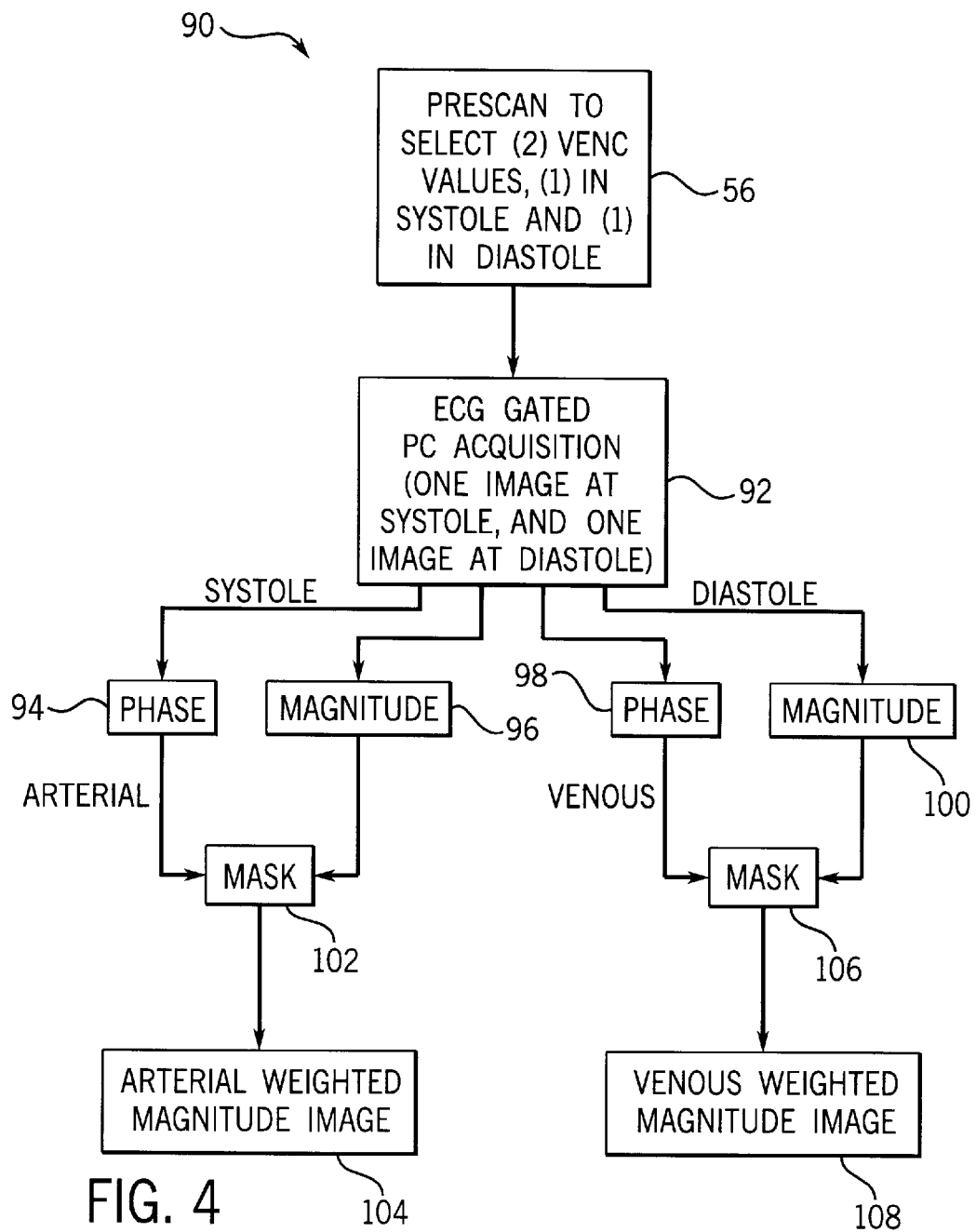
FIG. 4 is a flow chart of a portion of the system and method of the present invention.

Referring now to FIG. 4, the main algorithm 90 is shown in flow diagram form. After the prescan is concluded to select the first and second velocity encoding values 56, as described with reference to FIG. 3, an electrocardiograph (ECG) gated MRI acquisition is initiated at 92. One image is acquired during systole using the first velocity encoding value, while the other is acquired during diastole using the second velocity encoding value. Thus, a phase contrast MR image is acquired during each respective portion of the cardiac cycle where undesirable flow velocity signals are below that of the noise level established by the first and second velocity encoding values. The undesirable flow velocity signals include the venous signal during systole and the arterial signal during diastole, and each is suppressed during that portion of the cardiac cycle. The signals that are acquired then are the desirable flow velocity signals in the respective portion of the cardiac cycle. The desirable flow velocity signals include the arterial signal in systole and the venous signal in diastole.

In acquiring a phase contrast MR image during the systole portion of the cardiac cycle, a phase map image 94 and a magnitude image 96 are acquired for the arterial signal, and during diastole, a phase map image 98 and a magnitude image 100 are acquired for the venous signal. In reconstructing the MR images, the arterial signal phase map image 94 is masked 102 with the magnitude image 96 to reconstruct an arterial weighted magnitude image 104 for displaying an arterial only image having the venous signals suppressed. Similarly, the venous phase map image 98 is masked 106 with the venous magnitude image 100 to reconstruct a venous weighted magnitude image 108 for displaying a venous only image having the arterial signals suppressed.

Accordingly, an MRI apparatus for MR angiography is disclosed that is capable of creating arterial only images and venous only images. Such an MRI apparatus for MR angiography includes a magnetic resonance imaging system, such as that disclosed with reference to FIG. 1, and a computer 10, programmed to activate the MRI system in a prescan mode to acquire a venous signal during systole and an arterial signal during diastole from a monitored patient. The computer 10 is further programmed to set a first velocity encoding value such that the noise level in the phase image is at a level higher than the venous signal during systole and set a second velocity encoding value, which can include simply resetting the first velocity encoding value, such that the noise level in the second phase image is at a level higher than the arterial signal but below the venous signal during diastole. The system is then programmed to activate the MRI system to acquire a phase contrast image during systole using the first velocity encoding value to set a noise threshold for the systolic phase image, and acquire a phase contrast image during diastole using the second velocity encoding value to set the noise threshold for the diastolic phase image.

In accordance with this aspect of the invention, the computer is programmed to establish the first velocity encoding value during systole by dialing, or adjusting, the velocity encoding value so that the noise level is above a prescanned venous flow signal and acquires the phase contrast MR image during systole using the first velocity encoding value to set the noise threshold level in systole, thereby suppressing venous flow signals in systole. The second velocity encoding value is established during diastole by dialing the velocity encoding value down so that the noise level in diastole is below the venous flow signal but above the arterial flow signal and the phase contrast image is acquired during diastole using that second velocity encoding value, thereby suppressing arterial flow signals. The computer is thus programmed to compare the acquired venous and arterial signals, acquired during a prescan, to the first and second velocity encoding values, respectively, and if the first and second velocity encoding values are such that the noise levels are not greater than the acquired venous signal and arterial signal, respectively, then incrementing the velocity encoding value until both noise levels in the phase images are greater than the respective venous and arterial signals in the respective cardiac cycle. Then, the first and second velocity encoding values are used during the activation of the MRI system to acquire the phase map image and the magnitude image for the arterial only signals during systole and the venous only signals during diastole. The phase map images and the magnitude images can then be combined to create either or both a venous only image and/or an arterial only image.

Figure 5:
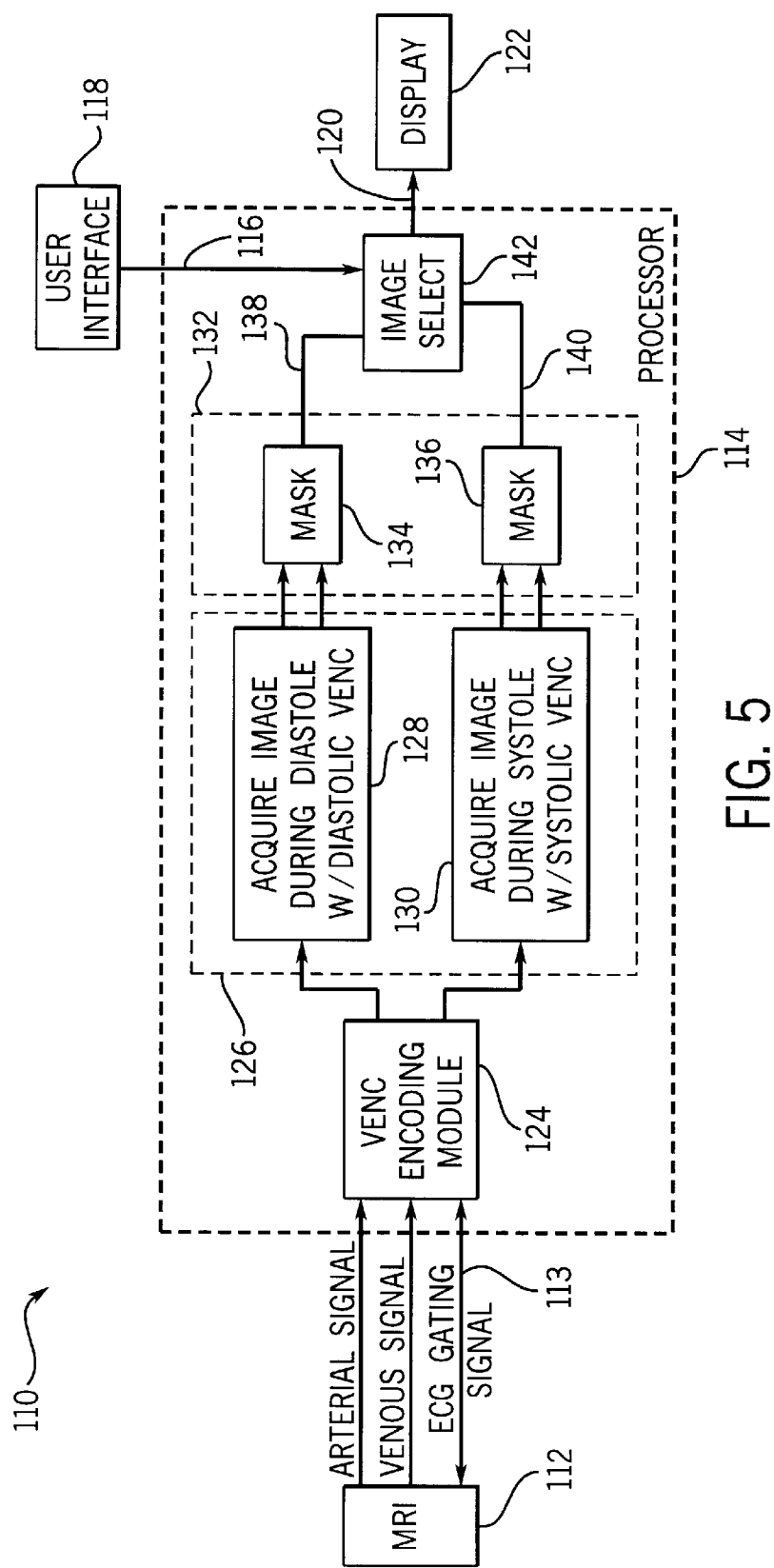
FIG. 5 is a schematic block diagram of the present invention.

Referring now to FIG. 5, an angiography system 110 is disclosed to create separate venous blood flow images and arterial blood flow images while suppressing arterial blood flow signals and venous blood flow signals, respectively. The angiography system 110 includes an MRI apparatus 112, similar to that disclosed with reference to FIG. 1 and capable of producing arterial and venous signals from a monitored patient. MRI apparatus 112 is activated by an ECG-gating signal 113 from a processor 114, which receives the arterial and venous signals from the MRI apparatus 112. The processor 114 also receives an input 116 from a user interface 118 and produces an output 120 to a display monitor 122. The processor 114 includes a velocity encoding (VENC) module 124 which receives the arterial and venous signals and produces the ECG-gating signal for the MRI apparatus 112. The VENC module 124 produces the first and second velocity encoding values that determines the noise threshold level for acquiring phase contrast images. The VENC module 124 produces the first velocity encoding value, a diastolic VENC value, that establishes a noise level in the phase image that is greater than the arterial signal during the diastolic period of the cardiac cycle and produces a second velocity encoding value, a systolic VENC value, that establishes a noise threshold level in the phase image greater than the venous signal, but less than the arterial signal in the systolic period.

The velocity encoding module 124 establishes the systolic VENC value during systole by dialing a velocity encoding value to set the noise threshold in the systolic phase image above a venous flow signal and acquires the phase contrast MR image during systole, thereby suppressing venous flow signals. The velocity encoding module 124 also establishes the diastolic VENC value during diastole by dialing the velocity encoding value to set the noise threshold in the diastolic phase image down below the venous flow signal but above an arterial flow signal and acquires the phase contrast image during diastole, thereby suppressing arterial flow signals.

The processor 114 also has a diastolic and systolic image acquisition and reconstruction module 126 connected to the velocity encoding module 124 to produce diastolic and systolic magnitude and phase images. The diastolic and systolic image acquisition and reconstruction module 126 includes a diastolic acquisition and reconstruction submodule 128 to acquire and reconstruct the magnitude and phase map images of the venous signal, without the arterial signals, using the diastolic VENC. The diastolic and systolic image acquisition reconstruction module 126 also includes a systolic image acquisition and reconstruction submodule 130 to acquire and reconstruct a magnitude image and a phase map image of the arterial signal, without the venous signal, using the systolic VENC during the systole portion of the cardiac cycle. A mask module 132 includes an arterial mask 134 and a venous mask 136 for combining the magnitude and phase map images to produce a venous only image 138 and an arterial only image 140. An image selector 142 is connected to the mask module 132 to receive the venous only image 138 and the arterial only image 140 and produce an output 120 to the display monitor 122 to display one of the venous only image 138 or the arterial only image 140 based on an input 116 from the user interface 118.

In another embodiment of the present invention, which is equivalently described with reference to FIG. 5, an MR angiography apparatus is disclosed for displaying only one of the venous blood flow image or the arterial blood flow image and includes a means for acquiring an MR image 112 and a means for ECG-gating MRI acquisitions 113 during a diastolic period and during a systolic period of a cardiac cycle. This apparatus also includes a means 124 for encoding a velocity encoding value for suppressing arterial blood flow signals during the diastolic period MRI acquisitions and for suppressing venous blood flow signals during the systolic period MRI acquisitions. A means 126 for acquiring and reconstructing a magnitude image and a phase map image for each diastolic period MRI acquisition 128 and systolic period MRI acquisition 130 is also provided, along with a means for combining 132 the reconstructed magnitude and phase map images to create venous only 138 and arterial only 140 output signals. A means for displaying 122, 142 either the venous only image 138, the arterial only image 140, or a combination of both on the display device is also disclosed. Preferably, a selection control means 142 receives an input 116 from a user interface 118 for selecting which of the venous blood flow and arterial blood flow images to display on a display device 122. The means for combining 132 preferably includes two masking modules 134 and 136 to combine respective magnitude and phase map images. It is understood that the foregoing description sets forth the preferred embodiment of the claimed MR angiography apparatus and is merely one example in determining equivalents.

In the preferred embodiment, the present invention utilizes a segmented k-space fast gradient echo phase contrast pulse sequence to simultaneously acquire separate arterial and venous flow sensitive images. The venous image is gated to systole with a relatively high VENC value and between 8 to 16 views per R—R segment. This acquisition scheme ensures minimal pulsatile flow artifacts and raises the phase image noise floor or threshold to suppress venous flow since venous velocities are much lower than arterial velocities in systole. In the same R—R interval, the venous image is gated to diastole with a much larger number of views per segment, preferably 32 to 64 since venous flow is not pulsatile. A different, lower VENC value is used to emphasize venous flow in the phase image while suppressing the arterial flow signals below the phase noise floor during diastole. From each of the data sets acquired, the magnitude reconstruction will have both arterial and venous information but the individual phase images will have only arterial or venous sensitivity. As described, the systole-gated acquisition will have the arterial information and the diastole-gated acquisition will have the venous information in the phase images. In recombining the four resulting images, two magnitude images and two phase images, a higher SNR arterial and venous image can also be acquired, or can be segmented to generate venous or arterial weighted magnitude images. By combining the magnitude images from both acquisitions, the SNR of the resulting magnitude image is significantly improved. The two acquisitions can be obtained or segmented over multiple cardiac cycles by acquiring the diastolic-gated acquisition during the diastolic part of the cardiac cycle and acquiring the systolic-gated acquisition during the systolic pass of the same cardiac cycle. In varying the views per segment, the data collection for the diastolic image may be complete before that of the systolic image. In the extra time required to complete the data acquisition for the systolic image, it is possible to reacquire the central k-space lines for the diastolic image, which effectively increases the number of averages of the diastolic image. Alternatively, higher k-space encoding lines can be acquired to improve the spatial resolution of the diastolic image. A further alternative is a combination of over-scanning the central k-space lines in acquisitions of higher spatial frequency lines to improve both image SNR and also resolution of the diastolic image.

The present invention has been described in terms of the preferred embodiment, and it is recognized that equivalents, alternatives, and modifications, aside from those expressly stated, are possible and within the scope of the appending claims.

What is claimed is:

1. A method of producing arterial suppressed images and venous suppressed images for MR angiography comprising the steps of:

setting a first velocity encoding value to establish a noise level in the phase image above that of undesirable flow velocity signals during a portion of a cardiac cycle;

setting a second velocity encoding value to establish a noise level in the phase image above that of undesirable flow velocity signals during another portion of the cardiac cycle;

acquiring a phase contrast MR image during each respective portion of the cardiac cycle where undesirable flow velocity signals are below that of the noise level established by the first and second velocity encoding values thereby suppressing the undesirable flow velocity signals and acquiring desirable flow velocity signals in the respective portion of the cardiac cycle; and reconstructing at least one MR image having desirable flow velocity signals acquired during one portion of the cardiac cycle without the undesirable flow velocity signals of that portion of the cardiac cycle.

2. The method of claim 1 wherein the step of acquiring a phase contrast MR image further comprises the steps of:

acquiring a phase map image and a magnitude image for each phase contrast MR image, the phase map image having arterial signals suppressed during diastole and venous signals suppressed during systole, thereby providing a well defined venous signal phase image map and a well defined arterial signal phase image map, and the magnitude images having both arterial and venous signals therein; and masking each phase map image with its respective magnitude image to acquire two images, one being a venous only image and one being an arterial only image.

3. The method of claim 1 wherein the first velocity encoding value is established during a systolic period to set the noise level in the systolic phase image above a value of a venous flow signal, and wherein the undesirable flow velocity signals are the venous flow signals.

4. The method of claim 1 wherein the second velocity encoding value is established during a diastolic period to set the noise level in the diastolic phase image above a value of an arterial flow signal, and wherein the undesirable flow velocity signals are the arterial flow signals.

5. The method of claim 1 wherein the first velocity encoding value is established during systole by dialing a velocity encoding value to adjust the noise level above a venous flow signal to set the first velocity encoding value, and the step of acquiring a phase contrast MR image is acquired during systole using the first velocity encoding value to establish the noise level, thereby suppressing venous flow signals, and the second velocity encoding value is established during diastole by dialing the velocity encoding value down to adjust the noise level below the venous flow signal but above an arterial flow signal, and the step of acquiring a phase contrast image is also acquired during diastole using the second velocity encoding value to establish the noise level, thereby suppressing arterial flow signals.

6. The method of claim 5 wherein the step of reconstructing at least one MR image is further defined to include one MR image displaying a venous only image and one MR image displaying an arterial only image.

7. The method of claim 5 further comprising the step of reducing a number of views per segment during systole, thereby reducing phase contrast acquisition time as compared to that in diastole, to minimize pulsatility artifacts from arterial flow signals.

8. The method of claim 7 further comprising the step of using additional time during diastole image acquisition to acquire additional k-space lines to improve resolution of the diastole image.

9. The method of claim 8 wherein the additional k-space line acquisition is used to improve overall image signal-to-noise ratio by averaging the central k-space lines.

10. The method of claim 5 further comprising the step of combining the phase contrast MR image acquired during systole with the phase contrast MR image acquired during diastole to generate an arterial and venous image with a high signal-to-noise ratio.

11. The method of claim 1 wherein the step of acquiring phase contrast MR images further includes acquiring two MR images, one in diastole and one in systole, substantially simultaneously.

12. The method of claim 1 wherein the steps of setting the first and second velocity encoding values is further defined as:
deciding whether the cardiac cycle is in systole or diastole;
monitoring an arterial signal during a diastolic period of the cardiac cycle and a venous signal during a systolic period of the cardiac cycle;
comparing the venous signal to the noise level as previously set by the first velocity encoding value and if the venous signal is greater than the noise level in the phase image corresponding to the first velocity encoding value, then incrementing the first velocity encoding value and repeating this comparing step, otherwise, providing the first velocity encoding value for use in the MR image acquisition step; and
comparing the arterial signal to the noise level as previously set by the second velocity encoding value and if the arterial signal is greater than the noise level in the phase image corresponding to the second velocity encoding value, then incrementing the second velocity encoding value and repeating this comparing step, otherwise, providing the second velocity encoding value for use in the MR image acquisition step.

13. An MRI apparatus for MR angiography capable of creating arterial only images and venous only images comprising:
a magnetic resonance imaging (MRI) system having a plurality of gradient coils positioned about a bore of a magnet to impress a polarizing magnetic field and an RF transceiver system and an RF modulator controlled by a pulse control module to transmit RF signals to an RF coil assembly to acquire MR images; and a computer programmed to:
activate the MRI system in a prescan mode to acquire a venous signal during systole and an arterial signal during diastole from a patient;
set a first velocity encoding value to establish a noise level at a level higher than the venous signal;
set a second velocity encoding value to establish a noise level at a level higher than the arterial signal; and
activate the MRI system to acquire a phase contrast image during systole using the first velocity encoding value as a noise threshold, and to acquire a phase contrast image during diastole using the second velocity encoding value as the noise threshold.

14. The MRI apparatus of claim 13 wherein the computer is further programmed to:
compare the acquired venous signal and arterial signal to the first and second velocity encoding values, respectively, and if the first and second velocity encoding values are not greater than the acquired venous signal and arterial signal, respectively, then incrementing a velocity encoding value until both velocity encoding values are greater than the respective venous and arterial signals in a respective cardiac cycle;
then use the first and second velocity encoding values during activation of the MRI system; and
combine the phase contrast images acquired during systole and diastole to reconstruct a higher SNR arterial and venous image.

15. The MRI apparatus of claim 13 wherein the computer is further programmed to:
acquire a phase map image and a magnitude image for each phase contrast MR image, the phase map image having arterial signals suppressed during diastole and venous signals suppressed during systole, thereby providing a well defined venous signal phase image map and a well defined arterial signal phase image map, and the magnitude images having both arterial and venous signals therein; and
mask a phase map image with its respective magnitude image to acquire at least one image, either a venous only image or an arterial only image.

16. The MRI apparatus of claim 15 wherein the computer is further programmed to:
establish the first velocity encoding value during systole by dialing a velocity encoding value above a venous flow signal and acquire the phase contrast MR image during systole using the first velocity encoding value as the noise level, thereby suppressing venous flow signals; and
establish the second velocity encoding value during diastole by dialing the velocity encoding value down such that the noise level in the phase contrast image is below the venous flow signal but above an arterial flow signal and acquire the phase contrast image during diastole using the second velocity encoding value to establish the noise level, thereby suppressing arterial flow signals.

17. The MRI apparatus of claim 16 wherein the computer is further programmed to reconstruct two MR images, a venous only image and an arterial only image.

18. An angiography system to create separate venous blood flow images and arterial blood flow images while suppressing arterial blood flow signals and venous blood flow signals, respectively, comprising:
an MRI apparatus capable of producing arterial and venous signals from a monitored patient;

a user interface to select an MR image output from a group consisting of an arterial only blood flow image and a venous only blood flow image;

a velocity encoding module connected to, and receiving the arterial and venous signals from, the MRI apparatus, and producing a diastolic VENC value that establishes a noise level in the phase image, the diastolic VENC value being greater than the arterial signal during a cardiac diastolic period, and a systolic VENC value that establishes a noise level in the phase image, the systolic VENC value being greater than the venous signal during a cardiac systolic period;

a diastolic and a systolic image acquisition and reconstruction module connected to the velocity encoding module to produce a diastolic and a systolic magnitude image and a diastolic and a systolic phase image; and a mask module connected to receive the diastolic and systolic magnitude and phase images and produce a venous blood flow image and an arterial blood flow image; and an image selector connected to the mask module to display either one of the venous blood flow image and the arterial blood flow image based on an input from the user interface.

19. The angiography system of claim 18 wherein the velocity encoding module is further defined to:

establish the systolic VENC value during systole by dialing a velocity encoding value above a venous flow signal and acquire the phase contrast MR image during systole using the systolic VENC value to establish the noise level, thereby suppressing venous flow signals; and establish the diastolic VENC value during diastole by dialing the velocity encoding value down below the venous flow signal but above an arterial flow signal and acquire the phase contrast image during diastole using the diastolic VENC value to establish the noise level, thereby suppressing arterial flow signals.

20. An MR angiography apparatus for displaying only one of venous blood flow and arterial blood flow comprising:

means for acquiring an MRI;

means for ECG-gating MRI acquisitions during a diastolic period and during a systolic period of a cardiac cycle;

means for encoding a velocity encoding value for suppressing arterial blood flow signals during the diastolic period MRI acquisitions and for suppressing venous blood flow signals during the systolic period MRI acquisitions;

means for acquiring and reconstructing a magnitude image and a phase map image for each diastolic period MRI acquisition and systolic period MRI acquisition;

means for combining the reconstructed magnitude and phase map images to create venous only and arterial only output signals; and means for displaying one of the venous only output signal as a venous blood flow image and the arterial only output signal as an arterial blood flow image.

21. The MR angiography apparatus of claim 20 further comprising a means for combining the venous only and arterial only output signals to create a venous and arterial blood flow image and an output means for selecting which of the venous blood flow, arterial blood flow, and venous and arterial blood flow images to display.

22. The MR angiography apparatus of claim 20 wherein the means for combining comprises a means for masking a respective magnitude image with a respective phase map image.

23. The MR angiography apparatus of claim 22 further comprising a selection control means for directing which of the venous and arterial blood flow images is displayed by the means for displaying.

* * * * *

UNITED STATES PATENT AND TRADEMARK OFFICE
CERTIFICATE OF CORRECTION

| | | |
|---|---|---|
| PATENT NO. | : 6,246,897 B1 | |
| APPLICATION NO. | : 09/210334 | |
| DATED | : June 12, 2001 | |
| INVENTOR(S) | : Foo et al. | |

It is certified that error appears in the above-identified patent and that said Letters Patent is hereby corrected as shown below:

On the cover page, (73) column 1, under "Assignee:" after "General Electric Company, Milwaukee, WI (US)", add -- ; Uniformed Services University of Health Sciences, Bethesda, MD (US) --.

Signed and Sealed this

Twenty-seventh Day of February, 2007

JON W. DUDAS
*Director of the United States Patent and Trademark Office*